(12) United States Patent
Yuan et al.

(10) Patent No.: US 12,230,639 B2
(45) Date of Patent: Feb. 18, 2025

(54) ARRAY SUBSTRATE AND PREPARATION METHOD THEREOF AND DISPLAY DEVICE

(71) Applicant: HKC CORPORATION LIMITED, Shenzhen (CN)

(72) Inventors: Xin Yuan, Shenzhen (CN); Xiufeng Zhou, Shenzhen (CN); Rongrong Li, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/385,876

(22) Filed: Oct. 31, 2023

(65) Prior Publication Data
US 2024/0213257 A1 Jun. 27, 2024

(30) Foreign Application Priority Data
Oct. 31, 2022 (CN) .......................... 202211348341.9

(51) Int. Cl.
*H01L 27/12* (2006.01)
(52) U.S. Cl.
CPC ........ *H01L 27/1225* (2013.01); *H01L 27/124* (2013.01); *H01L 27/127* (2013.01)
(58) Field of Classification Search
CPC ........... H01L 27/1225; H01L 29/78648; H01L 27/124; H01L 29/7869; H10K 59/131; H10K 59/1315
See application file for complete search history.

(56) References Cited

U.S. PATENT DOCUMENTS

| | | | |
|---|---|---|---|
| 2012/0175605 A1 | 7/2012 | Shin et al. | |
| 2014/0145195 A1 | 5/2014 | Kim et al. | |
| 2014/0319530 A1 | 10/2014 | Chung et al. | |
| 2016/0370621 A1* | 12/2016 | Huang | H01L 29/78648 |
| 2018/0294282 A1* | 10/2018 | Wang | H01L 27/124 |
| 2019/0227374 A1 | 7/2019 | Xie | |

(Continued)

FOREIGN PATENT DOCUMENTS

| | | |
|---|---|---|
| CN | 102593147 A | 7/2012 |
| CN | 106782258 A | 5/2017 |
| CN | 110797314 A | 2/2020 |

(Continued)

OTHER PUBLICATIONS

Allowed Claims in Chinese Patent No. 202211348341.9.

(Continued)

*Primary Examiner* — Peter M Albrecht
(74) *Attorney, Agent, or Firm* — Franklin & Associates International Inc; Matthew F. Lambrinos

(57) ABSTRACT

The present application relates to an array substrate and a preparation method thereof, and a display device; wherein the array substrate comprises a substrate and a plurality of sub-pixels distributed in an array on the substrate, the sub-pixels comprising M oxide thin film transistors, each oxide thin film transistor comprising a modulation electrode, a gate electrode, a source electrode and a drain electrode arranged in a stack, wherein the modulation electrodes of the M oxide thin film transistors are electrically connected to each other as a modulation layer, and the modulation layer is electrically connected to the gate electrode through N first vias, wherein M and N are both integers, and N<M.

4 Claims, 4 Drawing Sheets

(56) References Cited

U.S. PATENT DOCUMENTS

2019/0227397 A1   7/2019   Wang et al.
2020/0043864 A1   2/2020   Otsubo et al.

FOREIGN PATENT DOCUMENTS

| CN | 112397029 A  | 2/2021 |
| CN | 114664270 A  | 6/2022 |
| CN | 114724613 A  | 7/2022 |
| CN | 114883344 A  | 8/2022 |
| WO | 2022156010 A1 | 7/2022 |

OTHER PUBLICATIONS

Notice of Allowance dated Dec. 26, 2022 issued on CN202211348341.9.

Office Action dated Dec. 9, 2022 issued on CN202211348341.9.

* cited by examiner

ARRAY SUBSTRATE AND PREPARATION METHOD THEREOF AND DISPLAY DEVICE

CROSS-REFERENCE TO RELATED APPLICATIONS

The present application claims the priority of Chinese patent application 202211348341.9 filed on Oct. 31, 2022, entitled "Array Substrate and Preparation Method Thereof and Display Device", which is incorporated herein by reference in its entirety.

FIELD

The present application relates to the technical field of displays, in particular to an array substrate, a preparation method thereof, and a display device.

BACKGROUND

An Oxide Thin-Film Transistor (TFT) is a thin film transistor that uses an oxide semiconductor as an active layer or channel. The Oxide TFT devices are suitable for use in high resolution, high refresh rate, and large scale display devices where charge and discharge control are critical because of their high electron mobility, large area uniformity, low manufacture temperature, and good theoretical conductivity.

The oxide TFT is generally a four-terminal device including four terminals of a bottom gate, a top gate, a source electrode, and a drain electrode. In a conventional pixel circuit design, the bottom gate of each oxide TFT is connected to the top gate or the source electrode, resulting in that each oxide TFT needs to be designed with one more via, occupying a large space and affecting the aperture opening ratio of a product.

SUMMARY

An object of the present application is to provide an array substrate, a preparation method thereof, and a display device, which can reduce the number of vias, save the layout space of a pixel circuit and improve the aperture opening ratio of a product.

In a first aspect, the embodiments of the present application provide an array substrate including a substrate and a plurality of sub-pixels distributed in an array on the substrate, the sub-pixels including M oxide thin film transistors, each oxide thin film transistor including a modulation electrode, a gate electrode, a source electrode and a drain electrode arranged in a stack, wherein the modulation electrodes of the M oxide thin film transistors are electrically connected to each other as a modulation layer, and the modulation layer is electrically connected to the gate electrode through N first vias, wherein M and N are both integers, and N<M.

In a second aspect, embodiments of the present application provide a method for preparing an array substrate, including: forming a plurality of sub-pixels distributed in an array on a substrate, the sub-pixels including M oxide thin film transistors, each oxide thin film transistor including a modulation electrode, a gate electrode, a source electrode and a drain electrode arranged in a stack, wherein the modulation electrodes of the M oxide thin film transistors are electrically connected to each other as a modulation layer, and the modulation layer is electrically connected to the gate electrode through N first vias, wherein M and N are both integers, and N<M.

In a third aspect, embodiments of the present application provide a display device including an array substrate including a substrate and a plurality of sub-pixels distributed in an array on the substrate, the sub-pixels including M oxide thin film transistors, each oxide thin film transistor including a modulation electrode, a gate electrode, a source electrode and a drain electrode arranged in a stack, wherein the modulation electrodes of the M oxide thin film transistors are electrically connected to each other as a modulation layer, and the modulation layer is electrically connected to the gate electrode through N first vias, wherein M and N are both integers, and N<M.

According to the array substrate and the preparation method thereof, and the display device provided by the embodiments of the present application, by electrically connecting modulation electrodes of a plurality of oxide thin film transistors to each other as a modulation layer, and electrically connecting a gate electrode or a source electrode through first vias which are less than the number of the oxide thin film transistors, compared with the related art, the number of the first vias can be reduced, the layout space of a pixel circuit can be saved, and the aperture opening ratio of the product can be improved.

BRIEF DESCRIPTION OF THE DRAWINGS

Features, advantages, and technical effects of exemplary embodiments of the present application will be described below with reference to the accompanying drawings. In the drawings, like parts are provided with like reference numerals. The drawings are not drawn to scale and are merely intended to illustrate relative positional relationships. Layer thicknesses at certain locations are exaggerated for ease of understanding, and layer thicknesses in the drawings do not represent the scale of actual layer thicknesses.

Figure 1:
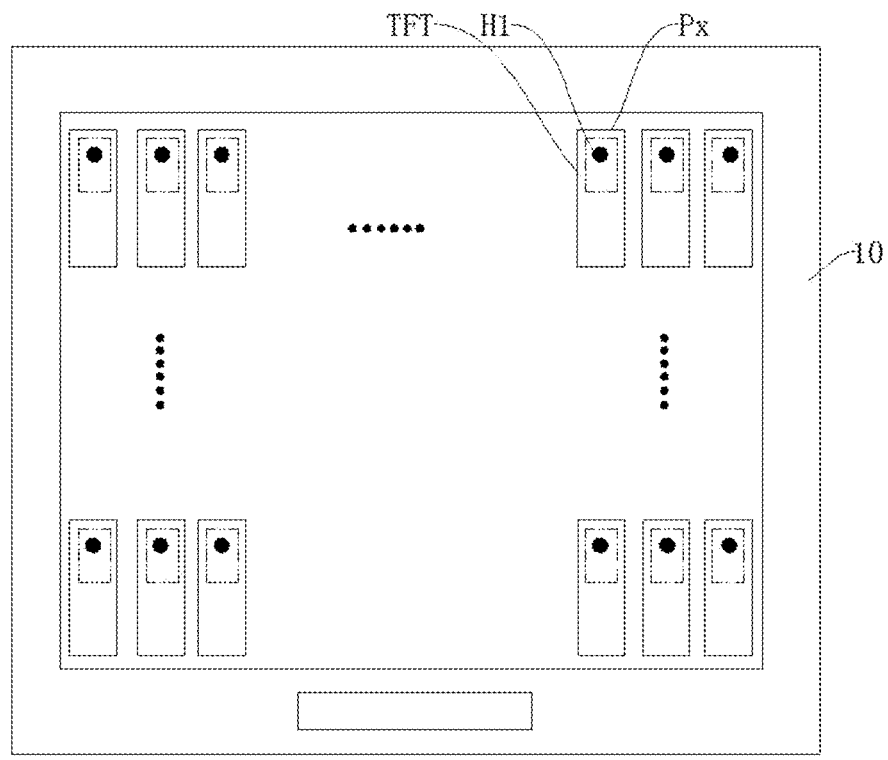
FIG. 1 is a schematic structural view showing an array substrate according to a first embodiment of the present application.

DESCRIPTION OF REFERENCE NUMERALS 1. array substrate;
10. substrate; 11. modulation layer; G0, modulation electrode; 12. buffer layer; 13. semiconductor layer; 130. channel region; 131. first conductive region; 132. second conductive region; 14. gate-insulating layer; 15. gate electrode layer; G1. gate electrode; V1. first voltage-regulated signal line; V2. second voltage-regulated signal line; 16. passivation layer; 17. source and drain electrode layer; H1. first via; H2. second via; H3. third via; S. source electrode; D. drain electrode; 17. metal overlap layer; 18. planarization layer; 19. electrode layer;

20. pixel defining layer; 21. light-emitting structure; 22. cathode layer; 23. packing layer.

DETAILED DESCRIPTION

Features and exemplary embodiments of various aspects of the present application are described in detail below. In the following detailed description, numerous specific details are set forth in order to provide a thorough understanding of the present application. However, it will be apparent to a person skilled in the art that the present application may be practiced without some of these specific details. The following description of the embodiments is merely exemplary of the invention to provide a better understanding of the invention. In the drawings and the following description, at least some well-known structures and techniques are not shown in order to avoid unnecessarily obscuring the present application. In addition, the dimensions of the region structures may be exaggerated for clarity. Further, the features, structures, or characteristics described below may be combined in any suitable manner in one or more embodiments.

An object of the present application is to provide an array substrate, a preparation method thereof, and a display panel, which can reduce the number of vias, save the layout space of a pixel circuit and improve the aperture opening ratio of a product. Hereinafter, embodiments will be described in detail with reference to the accompanying drawings.

First Embodiment

Figure 2:
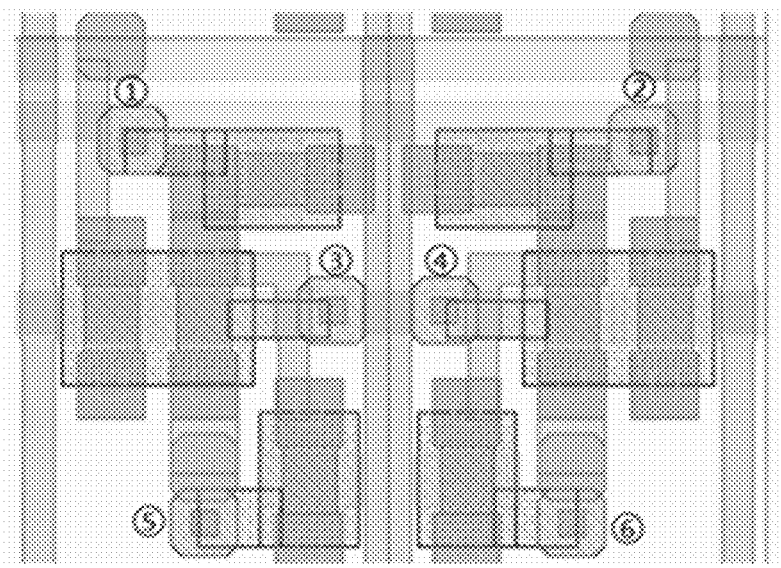
FIG. 2 is an enlarged schematic structural view showing each sub-pixel in the related art.
Figure 3:
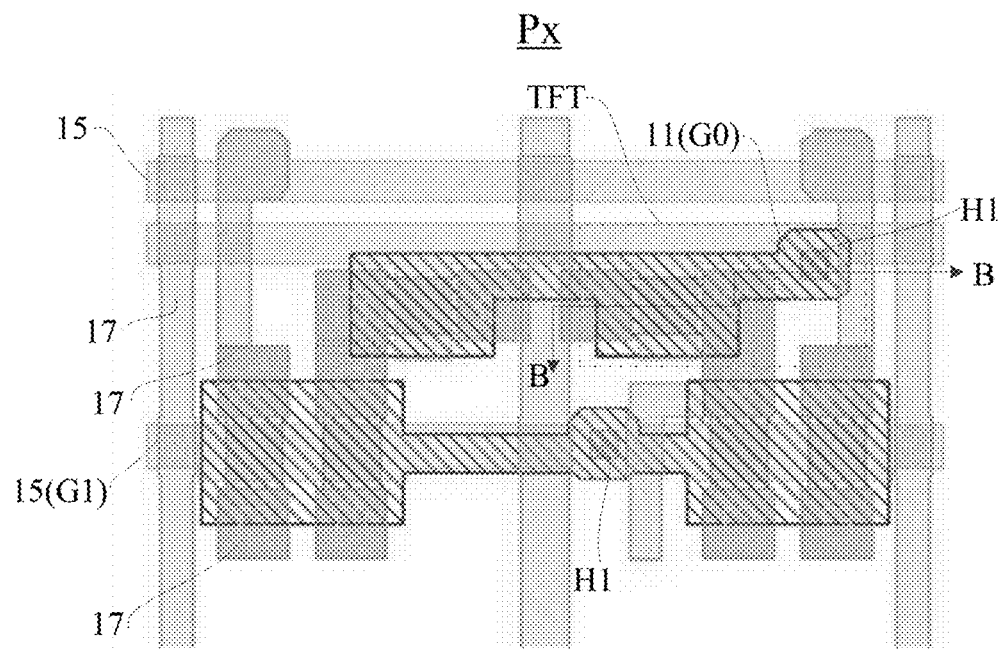
FIG. 3 is an enlarged schematic structural view showing each sub-pixel in FIG. 1.

FIG. 1 is a schematic structural view showing a structure of an array substrate according to a first embodiment of the present application; FIG. 2 is an enlarged schematic structural view showing each sub-pixel in the related art; FIG. 3 is an enlarged schematic structural view showing each sub-pixel in FIG. 1.

As shown in FIGS. 1-3, the array substrate according to the first embodiment of the present application includes a substrate 10 and a plurality of sub-pixels Px distributed in an array on the substrate 10, wherein the sub-pixels Px include M oxide thin film transistors, and each oxide TFT includes a modulation electrode G0, a gate electrode G1, a source electrode S and a drain electrode D arranged in a stack, wherein the modulation electrodes G0 of the M oxide TFT are electrically connected to each other as a modulation layer 11, and the modulation layer 11 is electrically connected to the gate electrode G1 through N first vias H1, wherein M and N are both integers, and N<M.

For the Oxide Thin-Film Transistor (Oxide TFT), oxide semiconductor is used as the active layer or channel, has better theoretical conductivity due to its higher electron mobility, better large area uniformity, lower preparation temperature and so on. Therefore, the oxide TFT device is suitable for high resolution, high refresh rate large-size display device which has strict requirements on charge and discharge control.

Alternatively, the substrate 10 is an insulating substrate such as a glass substrate. The array substrate includes a pixel circuit formed on a substrate 10, wherein the pixel circuit is a circuit structure for driving a sub-pixel Px to emit light, and generally includes a driving thin film transistor, a switching thin film transistor and a capacitor. The capacitor may temporarily store a voltage, the driving thin film transistor is driven to convert the stored voltage into a current, and the switching thin film transistor is used to control the turning on and off the driving thin film transistor.

As shown in FIG. 2, the pixel circuit may be, for example, "6T1C", i.e., 6 oxide TFT and 1 storage capacitor. Taking the "6T1C" pixel circuit as an example, in the related art, the modulation electrode G0 of each oxide TFT is electrically connected to the corresponding gate G1 through a via, resulting in that each sub-pixel Px needs 6 vias, and the serial numbers (1, 2, 3, 4, 5 and 6 marked in FIG. 2 are 6 vias, occupying a large space and affecting the aperture opening ratio of the product.

As shown in FIG. 3, according to the embodiment of the present application, modulation electrodes G0 of six oxide TFTs are electrically connected to each other as a modulation layer 11 which can be electrically connected to a gate electrode G1 or a source electrode S through two first vias H1, so that the threshold voltage of the oxide TFT can be adjusted. Compared with the related art, each sub-pixel Px is reduced four first vias H1, so that the space occupied by the vias can be greatly saved, and the layout space of the pixel circuit can be compressed, so that the aperture opening ratio of the product can be improved.

Of course, in other embodiments, after the modulation electrodes G0 of the six oxide TFT are electrically connected to each other as the modulation layer 11, the modulation layer 11 can be electrically connected to the gate electrode G1 or the source electrode S through one, three, four or five first vias H1, and as long as the number of the first vias H1 is less than the number of the oxide TFT, the layout space of the pixel circuit can be compressed and the aperture opening ratio of the product can be improved.

In addition, the pixel circuit of "6T1C" may further include at least one single gate TFT, which uses amorphous silicon (a-Si) as an active layer or channel and does not include a modulation electrode G0, and the remaining TFTs are all oxide TFTs.

Note that the pixel circuit in the present application is not limited to "6T1C" shown in FIG. 2, but may be any one of "2T1C", "3T1C", "5T2C", "7T1C", "7T2C", and "9T1C". Herein, "2T1C" means that the pixel circuit includes two thin film transistors and one storage capacitor, and the other "3T1C", "5T2C", "7T1C", "7T2C", and "9T1C", etc. will not be described in detail.

According to an array substrate according to an embodiment of the present application, by electrically connecting modulation electrodes G0 of a plurality of oxide TFT to each other as a modulation layer 11, and electrically connecting a gate electrode G1 or a source electrode S through first vias H1 which is less than the number of oxide TFT, the number of the first vias H1 can be reduced compared with the related art, the layout space of a pixel circuit can be saved, and the aperture opening ratio of a product can be improved.

Figure 4:
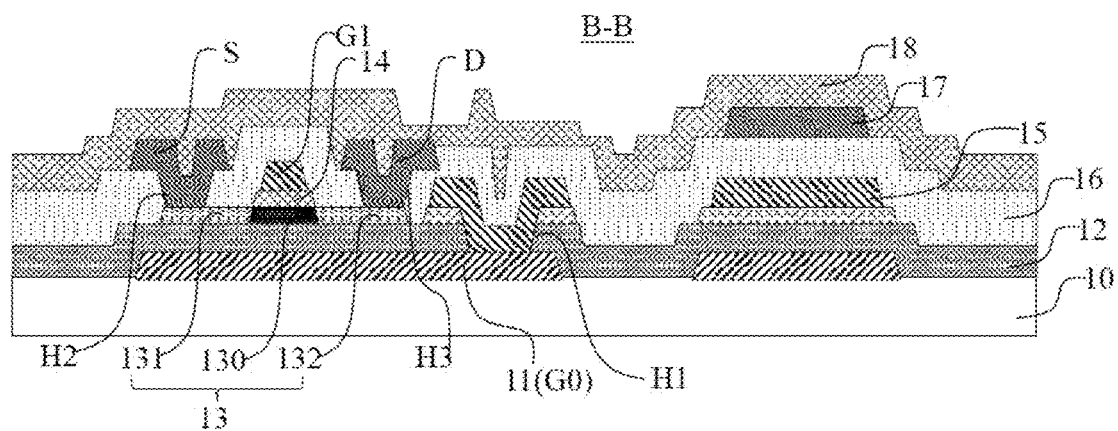
FIG. 4 shows a cross-sectional view of FIG. 3 along the direction B-B.

FIG. 4 shows a cross-sectional view of FIG. 3 along the direction B-B.

As shown in FIG. 4, the array substrate includes a modulation layer 11, a buffer layer 12, a semiconductor layer 13, a gate-insulating layer 14, and a gate electrode layer 15 successively formed on a substrate 10. The modulation electrode G0 is located in the modulation layer 11, and the first vias H1 penetrate through the buffer layer 12 and the gate-insulating layer 14.

The modulation layer 11 is electrically connected to the gate electrode G1 of the gate electrode layer 15 through first vias H1 penetrating the buffer layer 12 and the gate-insulating layer 14. The oxide TFT is prepared using a top gate self-aligned process. Here, the gate electrode layer 15 includes a plurality of gate electrodes G1, and may be formed of any one metal such as molybdenum (Mo), niobium (Nb), tungsten (W), aluminum (Al), chromium (Cr), copper (Cu), and silver (Ag), or an alloy of at least two metals. The material of the modulation layer 11 may be identical to that of the gate electrode layer 15 and will not be described again.

The gate-insulating layer 14 covers the semiconductor layer 13, and can prevent the semiconductor layer 13 from being affected when a patterned metal layer (e.g., a gate electrode) is prepared thereon, thereby improving the stability and reliability of the oxide TFT device. The gate-insulating layer 14 may be formed of, for example, SiOx or SiNx. The gate-insulating layer 14 may also be formed by laminating silicon oxide and silicon nitride. In addition, the gate-insulating layer 14 may also be formed by using aluminum oxide or tantalum oxide.

In some embodiments, the semiconductor layer 13 includes a first conductive region 131, a channel region 130 and a second conductive region 132, the channel region 130 is located between the first conductive region 131 and the second conductive region 132; the first conductive region 131 is electrically connected to the source electrode S through second vias H2 formed in the passivation layer 16, and the second conductive region 132 is electrically connected to the drain electrode D through third vias H3 formed in the passivation layer 16; the forward projection of the modulation layer 11 on the substrate 10 covers the forward projection of the channel region 130 on the substrate 10.

The material of the semiconductor layer 13 may be IGZO, In—Zn—O, In—Ga—O or In—Si—O. The IGZO is a compound of indium (In), gallium (Ga), zinc (Zn) and oxygen (O), In—Zn—O is a compound of indium (In), zinc (Zn) and oxygen (O), In—Ga—O is a compound of indium (In), gallium (Ga) and oxygen (O), and In—Si—O is a compound of indium (In), silicon (Si) and oxygen (O). The oxide semiconductor may be manufactured by magnetron sputtering and patterned by photolithography.

Since the conduction of the source S and drain D of the oxide TFT and the channel region 130 in the on-state needs to pass through the semiconductor layer 13 itself, in order to reduce the resistance of the semiconductor layer 13 to ensure its conduction, the first and second conductive regions 131 and 132 need to be subjected to a conductive treatment such as but not limited to hydrogen diffusion, annealing crystallization, ion implantation (B, F, He, P, etc.), plasma treatment, etc.

In addition, since the oxide TFT is very sensitive to short-wave light, the semiconductor layer 13 is close to the transparent substrate 10 and is easily irradiated by an external light source or ambient light, and the light stability of the oxide semiconductor layer 13 is poor. To this end, in this embodiment, by depositing a modulating layer 11 on the substrate 10, and the forward projection of the modulating layer 11 on the substrate 10 covering at least the forward projection of the channel region 130 on the substrate 10, the influence of light on the oxide TFT can be avoided.

In some embodiments, as shown in FIG. 4, the array substrate 1 further includes a passivation layer 16, a source and drain electrode layer 17, a planarization layer 18 and an electrode layer (not shown in the figure) successively formed on the gate electrode layer 15, wherein the electrode layer includes a plurality of electrodes. At least covering the oxide TFT with an electrode can reduce the influence of light on the light-emitting side of the oxide TFT on photo-generated carriers. In addition, when the oxide TFT uses IGZO as the semiconductor layer, the electrode layer may be provided to block hydrogen diffusion from back-end-process (e.g., packing) and improve the reliability of the oxide TFT.

When the array substrate is applied to an organic electroluminescent diode (OLED) display panel, a plurality of electrodes of the electrode layer are anodes of light-emitting elements, and the planarization layer can be prepared using an organic material, and a flat interface is provided for the anode taking advantage of the leveling property of the organic material.

Note that the oxide TFT in this embodiment may be used as a switching transistor or a driving transistor. Other elements such as scanning lines, data lines and the like may also be included on the array substrate, and these elements may be connected with the oxide TFT according to a connection relationship in the related art or arranged according to a positional relationship in the related art, which will not be described in detail.

Hereinafter, the method for preparing the array substrate according to the first embodiment of the present application will be described in detail.

The method for preparing an array substrate includes: forming a plurality of sub-pixels Px distributed in an array on a substrate 10, wherein the sub-pixels Px include M oxide TFT, and each oxide TFT includes a modulation electrode G0, a gate electrode G1, a source electrode S and a drain electrode D arranged in a stack, wherein the modulation electrodes G0 of the M oxide TFT are electrically connected to each other as a modulation layer 11, and the modulation layer 11 is electrically connected to the gate electrode G1 through N first vias H1, wherein M and N are both integers, and N<M.

Further, forming a plurality of sub-pixels Px distributed in an array on the substrate 10 includes the following steps S1 to S7:

step S1: depositing a modulation layer 11 on the substrate 10, and etching to form a plurality of modulation electrodes G0 connected to each other;

step S2: forming a patterned buffer layer 12 on the modulation layer 11, wherein the buffer layer 12 includes first vias H1 formed by etching and corresponding to a modulation electrode G0 and a gate electrode G1, wherein N first vias H1 of a plurality of sub-pixels arranged along a row direction X are aligned along the row direction X, and the first vias H1 of a plurality of sub-pixels arranged along a column direction Y are aligned along the column direction Y;

step S3: depositing on the buffer layer 12 to form a semiconductor layer 13, wherein the semiconductor layer 13 includes a channel region 130 and a first conductive region 131 and a second conductive region 132 formed by conducting treatment, and the channel region 130 is located between the first conductive region 131 and the second conductive region 132; wherein the forward projection of the modulation layer 11 on the substrate 10 at least covers the forward projection of the channel region 130 on the substrate 10;

step S4: depositing on the channel region 130 to form a gate-insulating layer 14, wherein the gate-insulating layer 14 includes first vias H1 corresponding to the first vias H1 of the buffer layer 12 formed by etching;

step S5: depositing on the gate-insulating layer 14 to form a gate electrode layer 15, wherein the gate electrode layer 15 includes a gate electrode G1 formed by etching, and the modulation layer 11 is electrically connected to the gate electrode G1 through corresponding first vias H1;

step S6: depositing on the gate electrode layer 15, the first conductive region 131, the second conductive region 132 and the buffer layer 12 to form a passivation layer 16, wherein the passivation layer 16 includes second vias H2 corresponding to the source electrode S and third vias H3 corresponding to the drain electrode D which are formed by etching; and step S7: depositing a source and drain electrode layer 17 on the passivation layer 16, wherein the source and drain electrode layer 17 includes etching to form a source electrode S and a drain electrode D distributed at intervals; and the first conductive region 131 is electrically connected to the source electrode S through the second vias H2, and the second conductive region 132 is electrically connected to the drain electrode D through the third vias H3.

It should be noted that in the present application, the patterning process may include a photolithography process, or include a photolithography process and an etching step, and may also include other processes for forming a predetermined pattern, such as printing, ink-jet, etc.; the photolithography process refers to a process such as using a photoresist, a mask plate, an exposure machine, etc. which includes a process such as film formation, exposure, development, etc. and a corresponding patterning process can be selected according to the structure formed in the present application.

According to the method for preparing an array substrate according to an embodiment of the present application, by electrically connecting modulation electrodes G0 of a plurality of oxide TFT to each other as a modulation layer 11, and electrically connecting a gate electrode G1 or a source electrode S through first vias H1 which is less than the number of oxide TFT, the number of the first vias H1 can be reduced compared with the related art, the layout space of a pixel circuit can be saved, and the aperture opening ratio of a product can be improved.

Second Embodiment

Figure 5:
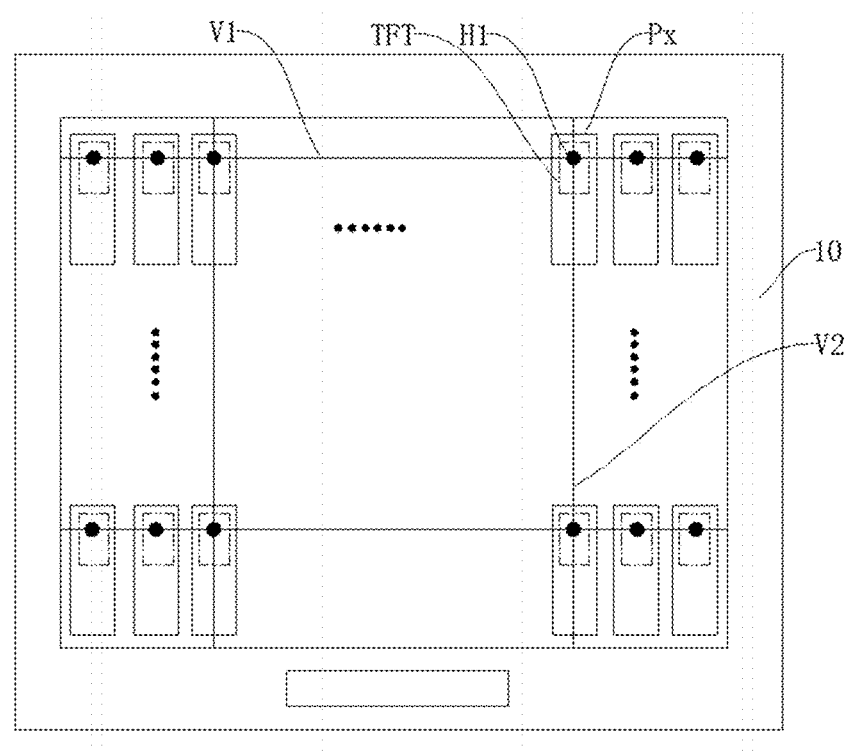
FIG. 5 is a schematic structural view showing an array substrate according to a second embodiment of the present application.
Figure 6:
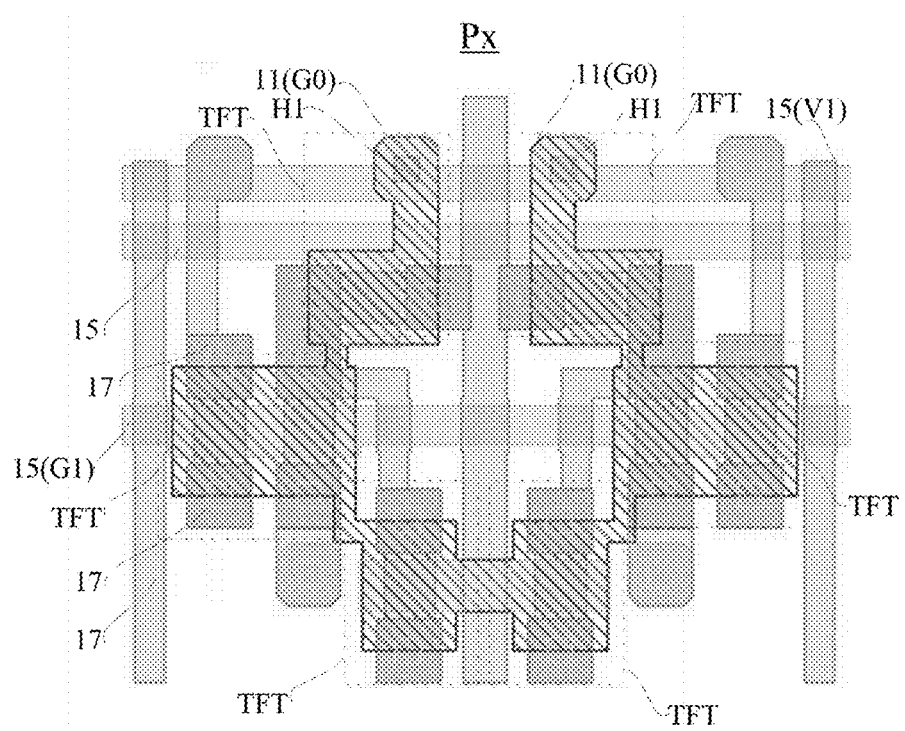
FIG. 6 is an enlarged schematic structural view showing each sub-pixel in FIG. 5.

FIG. 5 is a schematic structural view showing a structure of an array substrate according to a second embodiment of the present application; FIG. 6 shows an enlarged schematic structural view of each sub-pixel in FIG. 5.

As shown in FIGS. 5 and 6, the structure of the array substrate according to the second embodiment of the present application is similar to that of the array substrate according to the first embodiment, with the difference that the gate electrode layer 15 of the array substrate is further provided with a voltage-regulated signal line electrically connected to the first vias H1, which can effectively reduce the whole-surface impedance in the display panel, further improve the voltage uniformity of the modulation layers 11 in each region, and realize more accurate threshold voltage modulation.

Specifically, in some embodiments, the array substrate includes a first voltage-regulated signal line V1 extending along a row direction X, and N first vias H1 of a plurality of sub-pixels Px arranged along the row direction X are aligned along the row direction X and electrically connected to the first voltage-regulated signal line V1.

As shown in FIG. 5, N first vias H1 of a plurality of sub-pixels Px arranged along the row direction X are aligned and distributed along the row direction X, and the N first vias H1 are arranged in such a regular manner, which can effectively reduce the whole surface impedance in the display panel, improve the voltage uniformity of the modulation layer 11 in each region, and realize accurate threshold voltage modulation. In addition, the N first vias H1 are electrically connected to the first voltage-regulated signal line V1 extending in the row direction X, so that the threshold voltage of the oxide TFT can be stabilized and the performance of the oxide TFT can be stabilized.

In an example, the first voltage-regulated signal line V1 is any one of an initialized voltage signal line Vint, a reference voltage signal line Vref, and a low-level voltage signal line Vss.

In some embodiments, the array substrate further includes a second voltage-regulated signal line V2 extending along the column direction Y, and the first vias H1 of the plurality of sub-pixels Px arranged along the column direction Y are aligned and distributed along the column direction Y and are electrically connected to the second voltage-regulated signal line V2.

As shown in FIG. 5, the first vias H1 of the plurality of sub-pixels Px arranged in the column direction Y are aligned in the column direction Y and electrically connected to the second voltage-regulated signal line V2 extending in the column direction Y. In one example, the second voltage-regulated signal line V2 is any one of an initialized voltage signal line Vint, a reference voltage signal line Vref, and a low-level voltage signal line VSS. Further, the first voltage-regulated signal line V1 and the second voltage-regulated signal line V2 are of the same type, i.e., the first voltage-regulated signal line V1 and the second voltage-regulated signal line V2 may both be an initialized voltage signal line Vint, may both be a reference voltage signal line Vref, and may both be any one of low-level voltage signal lines Vss.

Thus, the first voltage-regulated signal line V1 and the second voltage-regulated signal line V2 cross each other to form a net-shaped voltage-regulated signal line, which can further effectively reduce the overall impedance in the display panel, further improve the voltage uniformity of the modulation layer 11 in each region, and achieve more accurate threshold voltage modulation.

Further, the array substrate includes a modulation layer 11, a buffer layer 12, a semiconductor layer 13, a gate-insulating layer 14, a gate electrode layer 15, a passivation layer 16 and a source and drain electrode layer 17 which are successively formed on a substrate 10. The modulation electrode G0 is located in the modulation layer 11, the first voltage-regulated signal line V1 and the second voltage-regulated signal line V2 are located in the gate electrode layer 15, and the first vias H1 penetrates through the buffer layer 12 and the gate-insulating layer 14.

In some embodiments, the array substrate 1 further includes a source and drain electrode layer 17, a planarization layer 18 and an electrode layer (not shown in the figure) successively formed on the passivation layer 16, and the electrode layer includes a plurality of electrodes. At least covering the oxide TFT with an electrode can reduce the influence of light on the light-emitting side of the oxide TFT on photo-generated carriers. In addition, when the oxide TFT uses IGZO as the semiconductor layer, the electrode layer may be provided to block hydrogen diffusion from back-end-process (e.g., packing) and improve the reliability of the oxide TFT.

Hereinafter, the method for preparing the array substrate according to the second embodiment of the present application will be described in detail.

The method for preparing an array substrate includes: forming a plurality of sub-pixels Px distributed in an array on a substrate 10, wherein the sub-pixels Px include M oxide TFT, and each oxide TFT includes a modulation electrode G0, a gate electrode G1, a source electrode S and a drain electrode D arranged in a stack, wherein the modulation electrodes G0 of the M oxide TFT are electrically connected to each other as a modulation layer 11, and the modulation layer 11 is electrically connected to the gate electrode G1 through N first vias H1, wherein M and N are both integers, and N<M.

Further, forming a plurality of sub-pixels Px distributed in an array on the substrate 10 includes the following steps S1 to S7:

step S1: depositing a modulation layer 11 on the substrate 10, and etching to form a plurality of modulation electrodes G0 connected to each other;

step S2: forming a patterned buffer layer 12 on the modulation layer 11, wherein the buffer layer 12 includes first vias H1 formed by etching and corresponding to a modulation electrode G0 and a gate electrode G1, wherein N first vias H1 of a plurality of sub-pixels arranged along a row direction X are aligned along the row direction X, and the first vias H1 of a plurality of sub-pixels arranged along a column direction Y are aligned along the column direction Y;

step S3: depositing on the buffer layer 12 to form a semiconductor layer 13, wherein the semiconductor layer 13 includes a channel region 130 and a first conductive region 131 and a second conductive region 132 formed by conducting treatment, and the channel region 130 is located between the first conductive region 131 and the second conductive region 132; wherein the forward projection of the modulation layer on the substrate at least covers the forward projection of the channel region on the substrate;

step S4: depositing on the channel region 130 to form a gate-insulating layer 14, wherein the gate-insulating layer 14 includes first vias H1 corresponding to the first vias H1 of the buffer layer 12 formed by etching;

step S5: depositing on a gate-insulating layer 14 to form a gate electrode layer 15, wherein the gate electrode layer 15 includes a gate electrode G1 formed by etching, a first voltage-regulated signal line V1 extending along a row direction X and a second voltage-regulated signal line V2 extending along a column direction Y, wherein the first voltage-regulated signal line V1 is electrically connected to N first vias H1 of a plurality of sub-pixels Px arranged along the row direction X, and the second voltage-regulated signal line V2 is electrically connected to the first vias H1 of the plurality of sub-pixels Px arranged along the column direction Y;

step S6: depositing on the gate electrode layer 15, the first conductive region 131, the second conductive region 132 and the buffer layer 12 to form a passivation layer 16, wherein the passivation layer 16 includes first vias H1 corresponding to the gate electrode G1, second vias H2 corresponding to the source electrode S and third vias H3 corresponding to the drain electrode D which are formed by etching;

step S7: depositing a source and drain electrode layer 17 on the passivation layer 16, wherein the source and drain electrode layer 17 includes etching to form a source electrode S and a drain electrode D distributed at intervals; and the first conductive region 131 is electrically connected to the source electrode S through the second vias H2, and the second conductive region 132 is electrically connected to the drain electrode D through the third vias H3.

Figure 7:
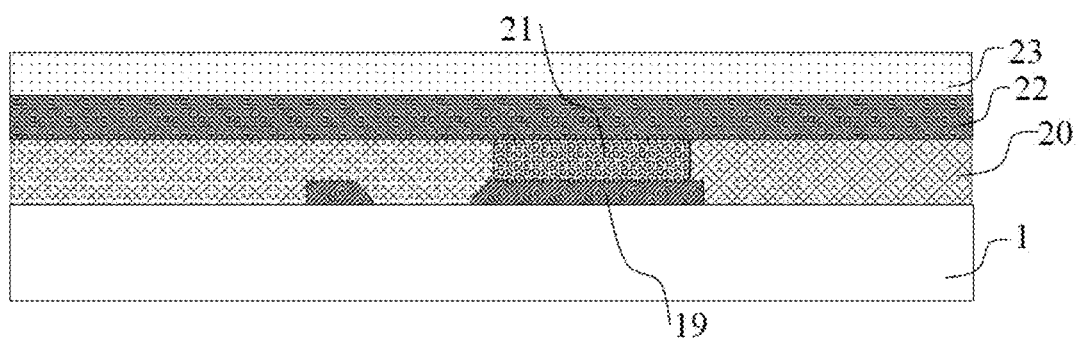
FIG. 7 is a schematic structural view showing a display device according to an embodiment of the present application.

FIG. 7 is a schematic structural view showing a display device according to an embodiment of the present application.

As shown in FIG. 7, embodiments of the present application also provide a display device including any of the array substrates described above. The display device may be implemented as, for example, a liquid crystal display device, an organic electroluminescent diode (OLED) display panel, an electronic book, a mobile phone, a tablet computer, a television, a display, a notebook computer, a digital photo frame, a navigator, or any product or component having a display function.

In an example, as shown in FIG. 7, the display device is an OLED display panel including an array substrate 1 and a pixel defining layer 20, a light emitting layer 21, a cathode layer 22 and a packing layer 23 located on the array substrate 1.

The pixel defining layer 20 includes a plurality of pixel openings, and the light-emitting layer 21 includes a plurality of light-emitting elements distributed in an array, wherein each light-emitting element corresponds to a pixel opening of the pixel defining layer 20, and the pixel opening exposes the anode of the electrode layer 19. The light-emitting element includes a light-emitting structure on an anode and a cathode 22 on the light-emitting structure.

A packing layer 23 is located on the side of the cathode layer 22 facing away from the array substrate 1. The packing layer 23 includes a first inorganic layer, an organic layer, and a second inorganic layer which are successively stacked. Inorganic materials have both good light-transmitting properties and good water and oxygen barrier properties. The organic layer is a patterned organic layer, which has high elasticity; the organic layer is sandwiched between the first inorganic layer and the second inorganic layer, and can not only inhibit the cracking of the inorganic film and release the stress between the inorganics, but also improve the flexibility of the whole packing layer 23, thereby achieving a reliable flexible packing.

In another example, the display device may also be a Micro/Mini-LED display, which includes a light-emitting layer and a cover plate on an array substrate. The light-emitting layer includes a plurality of light-emitting elements distributed in an array, and the light-emitting elements can be any one of Micro-LED and Mini-LED.

In another example, the display device may also be a liquid crystal display including a liquid crystal display panel and a backlight module arranged on a backlight side of the liquid crystal display panel, the backlight module being used for providing a light source to the liquid crystal display panel. The liquid crystal display panel includes an array substrate, a color film substrate and a liquid crystal layer located between the array substrate and the color film substrate which are oppositely arranged.

It should be readily understood that "on", "above", and "over" in this application should be interpreted in the broadest manner so that "on" does not only mean "directly on", but also includes the meaning of "on something" with intervening features or layers in between, and "above" or "over" does not include the meaning of "on something" or "over something", but may include the meaning of "on something" or "over something" without intervening features or layers in between (i.e. directly on something).

As used herein, the term "substrate "refers to a material upon which a subsequent layer of material is added. The substrate itself may be patterned. The material added on top of the substrate may be patterned or may remain unpatterned. In addition, the substrate may include a wide range of materials, such as silicon, germanium, gallium arsenide, indium phosphide, and the like. Alternatively, the substrate may be made of a non-conductive material (e.g., a glass, plastic, or sapphire wafer, etc.).

As used herein, the term "layer" may refer to a portion of material that includes a region having a thickness. The layer may extend over the entire underlying or overlying structure, or may have a smaller extent than that of the underlying or overlying structure. In addition, a layer may be a region of a continuous structure that is homogeneous or heterogeneous and has a thickness that is less than the thickness of the continuous structure. For example, a layer may be located between the top and bottom surfaces of the continuous structure or between any pair of transverse planes at the top and bottom surfaces. The layers may extend laterally, vertically and/or along a tapered surface. The substrate can be a layer, can include one or more layers therein, and/or can have one or more layers thereon, above, and/or below. The layer may include a plurality of layers. For example, the interconnect layer may include one or more conductors and contact layers (within which contacts, interconnect lines, and/or holes are formed) and one or more dielectric layers.

Finally, it should be noted that: the above embodiments are only used to illustrate the technical solution of the present application, and not to limit the same; while the application has been described in detail and with reference to the foregoing embodiments, it will be understood by a person skilled in the art that: the technical solutions described in the foregoing embodiments may still be modified, or some or all of the technical features may be equivalently replaced; and these modifications or substitutions do not depart from the spirit of the corresponding technical solutions of the embodiments of the present application.

What is claimed is:

1. An array substrate, comprising a substrate and a plurality of sub-pixels distributed in an array on the substrate, wherein the sub-pixels comprise M oxide thin film transistors, and each of the oxide thin film transistors comprises a modulation electrode, a gate electrode, a source electrode, and a drain electrode which are arranged in a stack, wherein the modulation electrodes of the M oxide thin film transistors are electrically connected to each other as a modulation layer, and the modulation layer is electrically connected to the gate electrode through N first vias, wherein M and N are both integers, and N<M;

the array substrate further comprising a first voltage-regulated signal line extending in a row direction, wherein the first vias of the plurality of the sub-pixels arranged in the row direction are aligned in the row direction and electrically connected to the first voltage-regulated signal line;

the array substrate further comprising a second voltage-regulated signal line extending in a column direction, wherein the first vias of the plurality of sub-pixels arranged in the column direction are aligned in the column direction and electrically connected to the second voltage-regulated signal line;

the array substrate further comprising the modulation layer, a buffer layer, a semiconductor layer, a gate-insulating layer, a gate electrode layer, a passivation layer, and a source and drain electrode layer which are successively formed on the substrate, wherein the modulation electrode is located in the modulation layer, the first voltage-regulated signal line and the second voltage-regulated signal line are located in the gate electrode layer, and the first vias penetrate the buffer layer and the gate-insulating layer.

2. The array substrate according to claim 1, wherein the first voltage-regulated signal line and the second voltage-regulated signal line are any one of an initialized voltage signal line, a reference voltage signal line, and a low-level voltage signal line.

3. The array substrate according to claim 1, wherein the semiconductor layer comprises a first conductive region, a channel region and a second conductive region, wherein the channel region is located between the first conductive region and the second conductive region; the first conductive region is electrically connected to the source electrode through second vias formed in the passivation layer, and the second conductive region is electrically connected to the drain electrode through third vias formed in the passivation layer; the forward projection of the modulation layer on the substrate covers at least the forward projection of the channel region on the substrate.

4. A display device, comprising: the array substrate according to claim 1.

* * * * *